United States Patent
Matsumoto

(10) Patent No.: US 7,846,831 B2
(45) Date of Patent: Dec. 7, 2010

(54) METHOD OF FORMING A METAL BUMP ON A SEMICONDUCTOR DEVICE

(75) Inventor: Takeshi Matsumoto, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/453,299

(22) Filed: May 6, 2009

(65) Prior Publication Data

US 2009/0221142 A1     Sep. 3, 2009

Related U.S. Application Data

(63) Continuation of application No. 11/785,845, filed on Apr. 20, 2007, now abandoned.

(30) Foreign Application Priority Data

May 1, 2006   (JP)   .............................. 2006-127168

(51) Int. Cl.
*H01L 21/44*   (2006.01)
*H01L 21/4763*   (2006.01)
(52) U.S. Cl. ...................... 438/618; 438/612; 438/613; 438/614

(58) Field of Classification Search ................. 438/618, 438/614, 608, 610, 611, 612, 613, 615, 616, 438/617
See application file for complete search history.

(56) References Cited

U.S. PATENT DOCUMENTS

| 7,452,803 | B2 * | 11/2008 | Lin et al. ..................... 438/624 |
| 2003/0052409 | A1 | 3/2003 | Matsuo et al. |
| 2003/0153172 | A1 * | 8/2003 | Yajima et al. ............... 438/612 |
| 2006/0154469 | A1 | 7/2006 | Hess et al. |

FOREIGN PATENT DOCUMENTS

JP     2001-332577     11/2001

OTHER PUBLICATIONS

Wolf, S., Silicon Processing for the VLSI Era, vol. 4: Deep-Submicron Process Technology, Chapter 16, Copper Interconnect Process Technology, p. 711, 2002, Lattice Press, Sunset Beach, CA.

* cited by examiner

*Primary Examiner*—Chuong A. Luu
(74) *Attorney, Agent, or Firm*—Steptoe & Johnson LLP

(57) ABSTRACT

An uppermost one of multilayered electrode pads, on which a bump and a plating coat will be formed, is made of metal having high ionization tendency, particularly, Al. On the other hand, an uppermost one of multilayered electrode pads, on which none of the bump and the plating coat will be formed, is made of metal having low ionization tendency, particularly, Cu.

12 Claims, 9 Drawing Sheets

METHOD OF FORMING A METAL BUMP ON A SEMICONDUCTOR DEVICE

This application is a continuation of application Ser. No. 11/785,845 filed on Apr. 20, 2007, now ABN

BACKGROUND OF THE INVENTION (1) Field of the Invention

The present invention relates to a structure of a semiconductor device in which, for example, a plurality of semiconductor chips and a scribe grid are formed on a wafer-shaped substrate. In particular, the present invention relates to structures of electrode pads provided on such semiconductor chip and scribe grid.

(2) Description of the Related Art

Conventionally, there is manufactured a semiconductor device having a structure in which, for example, a plurality of semiconductor chips, each having a semiconductor circuit integrated thereon, and a scribe grid are formed on a wafer-shaped substrate. Herein, a region called the scribe grid is used as a "spacing" along which the wafer is cut to obtain a semiconductor circuit as a semiconductor chip. In order to determine whether or not the semiconductor circuit in the semiconductor chip is formed without fail, a plurality of elements called process control modules (hereinafter, referred to as "scribe PCMs") are formed on the scribe grid.

Hereinafter, a description will be given of a conventional semiconductor device (refer to, e.g., JP2001-332577A) with reference to the drawings.

FIGS. 4A to 4C specifically illustrate a semiconductor chip and a scribe PCM formed on a wafer in the conventional semiconductor device. At present, a semiconductor device is typically formed into a wafer shape as illustrated in FIG. 4A. Normally, a plurality of semiconductor chips 2, each having a semiconductor circuit integrated thereon, are formed on a wafer 1 through a manufacturing process called a diffusion process. Thereafter, as illustrated in FIG. 4B, each semiconductor chip 2 is cut out from the wafer 1, and then is subjected to packaging and the like; accordingly, a chip-shaped semiconductor integrated circuit (LSI) is manufactured. Herein, as illustrated in FIG. 4C, a plurality of scribe PCMs 4 are formed on a scribe grid 3.

Each scribe PCM 4 includes multilayered electrode pads 5 for external electrical connection. Formation of such scribe PCM 4 on the scribe grid 3 makes it possible to examine quality of the semiconductor device as the entire wafer 1, particularly, electrical quality thereof. Although not illustrated in the drawings, a plurality of multilayered electrode pads for external electrical connection are also provided on each semiconductor chip 2.

FIGS. 5A to 5D are sectional views each illustrating a process for forming bumps on an electrode pad 5 of a scribe PCM 4 formed on the scribe grid 3 and an electrode pad 6 of a semiconductor chip 2, respectively, by electroless plating in the conventional semiconductor device. As an example, the drawings show that the semiconductor device has a multi-layer structure of three wiring layers.

As illustrated in FIG. 5A, three electrode pads 5 (6) are laminated in a vertical direction. Herein, the uppermost one of the three electrode pads 5 (6) is made of Al. In FIG. 5A, the electrode pad 5 of the scribe PCM 4 is illustrated on a left side and the electrode pad 6 of the semiconductor chip 2 is illustrated on a right side.

First, as illustrated in FIG. 5B, Zn plating is performed in an electroless manner. Thus, Zn plating layers 7 are formed on the electrode pad 5 of the scribe PCM 4 and the electrode pad 6 of the semiconductor chip 2, respectively. A mechanism of the Zn plating is as follows. That is, Al which is a material for the electrode pad 5 (6) is dissolved in an electroless Zn plating solution as Al ions 6a with difference in ionization tendency between Al and Zn (ionization tendency: Al>Zn). Then, Zn ions 7a in the electroless Zn plating solution are deposited on the electrode pad 5 (6); thus, the Zn plating layer 7 is formed. In other words, displacement plating is performed herein.

Next, as illustrated in FIG. 5C, Ni plating is performed in an electroless manner. Thus, Ni bumps 8 are formed on the Zn plating layer 7 of the electrode pad 5 of the scribe PCM 4 and the Zn plating layer 7 of the electrode pad 6 of the semiconductor chip 2, respectively. A mechanism of the Ni plating is as follows. That is, Zn in the Zn plating layer 7 is dissolved in an electroless Ni plating solution as Zn ions 7a with difference in ionization tendency between Zn and Ni (ionization tendency: Zn>Ni). Then, Ni ions 8a in the electroless Ni plating solution are deposited on the Zn plating layer 7; thus, the Ni bump 8 is formed. In other words, displacement plating is performed herein.

Next, as illustrated in FIG. 5D, Au plating is performed in an electroless manner. Thus, Au plating layers 9 are formed on the Ni bump 8 of the electrode pad 5 of the scribe PCM 4 and the Ni bump 8 of the electrode pad 6 of the semiconductor chip 2, respectively. A mechanism of the Au plating is as follows. That is, Ni in the Ni bump 8 is dissolved in an electroless Au plating solution as Ni ions 8a with difference in ionization tendency between Ni and Au (ionization tendency: Ni>Au). Then, Au ions 9a in the electroless Au plating solution are deposited on the Ni bump 8; thus, the Au plating layer 9 is formed. In other words, displacement plating is performed herein.

FIG. 6 specifically illustrates an electroless plating method performed on the conventional semiconductor device illustrated in FIGS. 5B to 5D. A mechanism of the electroless plating method is as follows. That is, the metal material for the electrode pad 5 of the scribe PCM 4 and the electrode pad 6 of the semiconductor chip 2 is dissolved in a plating solution 13 (herein, a Zn plating solution, a Ni plating solution or an Au plating solution) as metal ions 14 (herein, Al ions, Zn ions or Ni ions) with difference in ionization tendency (ionization tendency: Al>Zn>Ni>Au). Then, metal ions 15 (herein, Zn ions, Ni ions or Au ions) in the plating solution 13 are deposited on the electrode pad 5 of the scribe PCM 4 and the electrode pad 6 of the semiconductor chip 2; thus, a plating layer (herein, a Zn plating layer, a Ni plating layer or an Au plating layer) is formed.

FIGS. 7A and 7B are sectional views each illustrating a dicing process for cutting the electrode pad 5 of the scribe PCM 4 with a bump formed on the electrode pad 5 as illustrated in FIG. 5D, thereby to obtain a semiconductor chip 2 from the wafer 1.

As illustrated in FIG. 7A, the scribe grid 3 (together with the scribe PCM 4, the electrode pad 5 of the scribe PCM 4, and the Ni bump 8 and the Au plating layer 9 on the electrode pad 5) is cut by means of a dicing cutter 10. Thus, as illustrated in FIG. 7B, a semiconductor chip 2 can be cut out from the wafer 1.

In the conventional semiconductor device, however, the structure of the electrode pad 5 illustrated in FIG. 5D causes the following problems.

FIGS. 8A and 8B are sectional views each illustrating a dicing process for cutting the electrode pad 5 of the scribe PCM 4 with a bump formed on the electrode pad 5 as illustrated in FIG. 5D, thereby to obtain a semiconductor chip 2 from the wafer 1, similarly to FIGS. 7A and 7B. As illustrated in FIG. 8A, the scribe grid 3 (together with the scribe PCM 4, the electrode pad 5 of the scribe PCM 4, and the Ni bump 8 and the Au plating layer 9 on the electrode pad 5) is cut by means of the dicing cutter 10.

If the dicing cutter 10 deviates from an appropriate position as illustrated in FIG. 8A, an abnormal state occurs as illustrated in FIG. 8B. Specifically, the Ni bump 8 and the like are partially left at an edge portion even after the dicing process. If the conductive Ni bump 8 is left at the edge portion, electrical leakage may occur at the "left bump" in a case where the semiconductor chip 2 is subjected to packaging subsequently.

FIG. 9 is a sectional view illustrating a dicing process for cutting the electrode pad 5 of the scribe PCM 4 with a bump formed on the electrode pad 5 as illustrated in FIG. 5D, thereby to obtain a semiconductor chip 2 from the wafer 1, similarly to FIGS. 8A and 8B. As illustrated in FIG. 9, the scribe grid 3 (together with the scribe PCM 4, the electrode pad 5 of the scribe PCM 4, and the Ni bump 8 and the Au plating layer 9 on the electrode pad 5) is cut by means of a dicing cutter 10. The dicing cutter 10 used herein has a large width in order to prevent the bump from being partially left at an edge portion.

Thus, it is possible to prevent the bump 8 from being partially left at the edge portion. However, since the width of the dicing cutter 10, that is, a width of a "spacing" becomes large, the scribe grid 3 must be made larger in width in conjunction. As a result, the scribe grid 3 formed on the wafer 1 is larger in width than the aforementioned scribe grid 3 illustrated in FIG. 7A (a lower side of FIG. 9). Consequently, an area for formation of semiconductor chips 2 is disadvantageously decreased in the wafer 1, so that there is a possibility that semiconductor chips 2 to be obtained from one wafer are reduced in number.

SUMMARY OF THE INVENTION

The present invention is devised in order to solve the aforementioned conventional problems. An object of the present invention is to provide a semiconductor device having the following advantages. That is, it is possible to prevent a "left bump" from being generated upon performance of dicing on an electrode pad of a scribe PCM, thereby to prevent occurrence of electrical leakage from such "left bump". Further, it is possible to suppress reduction in number of semiconductor chips to be obtained from one wafer due to a widening of a scribe grid.

In order to accomplish this object, according to a first aspect of the present invention, a semiconductor device includes: a substrate; a semiconductor chip and a scribe grid formed on the substrate; and a plurality of multilayered electrode pads provided on the semiconductor chip and the scribe grid, respectively. Herein, the uppermost one of the multilayered electrode pads, on which a bump and a plating coat will be formed, is made of metal having ionization tendency higher than those of materials for the bump and the plating coat. Further, the uppermost one of the multilayered electrode pads, on which none of the bump and the plating coat will be formed, is made of metal having ionization tendency lower than those of the materials for the bump and the plating coat.

According to a second aspect of the present invention, the bump and the plating coat are formed on the electrode pad provided on the semiconductor chip, but are not formed on the electrode pad provided on the scribe grid.

According to a third aspect of the present invention, the metal having high ionization tendency is Al, and the metal having low ionization tendency is Cu.

According to the present invention, as described above, it is possible to form a bump on an electrode pad of a semiconductor chip without forming a bump on an electrode pad of a scribe PCM on a spacing for dicing.

Therefore, it is possible to prevent a "left bump" from being generated upon performance of dicing on an electrode pad of a scribe PCM, thereby to prevent occurrence of electrical leakage from such "left bump".

Unlike a conventional technique, moreover, it is possible to suppress reduction in number of semiconductor chips to be obtained from one wafer due to a widening of a scribe grid.

In addition, it is possible to selectively perform plating on a plurality of electrode pads even in an electroless manner.

BRIEF DESCRIPTION OF THE INVENTION

DESCRIPTION OF THE PREFERRED EMBODIMENTS

Hereinafter, a specific description will be given of preferred embodiments of the present invention with reference to the drawings.

First Embodiment

First, a description will be given of a semiconductor device according to a first embodiment of the present invention.

FIGS. 1A to 1D are sectional views each illustrating a case where a bump is not formed on an electrode pad 5 of a scribe PCM 4 formed on a scribe grid 3, but is formed on an electrode pad 6 of a semiconductor chip 2 by electroless plating, in the semiconductor device according to the first embodiment. In this embodiment, the semiconductor device has a multilayer structure of three wiring layers.

Figure 1A:
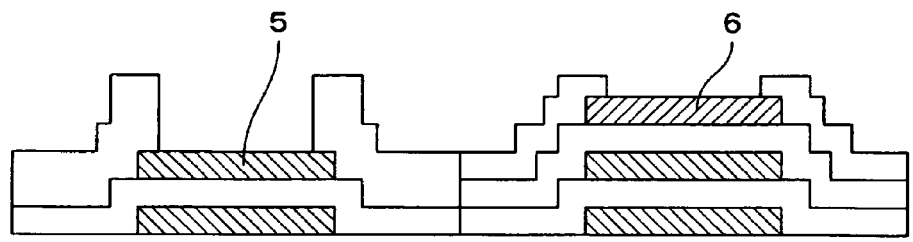
FIGS. 1A to 1D are sectional views each illustrating a process for bump formation in a semiconductor device according to a first embodiment of the present invention.

FIG. 1A illustrates a shape of the semiconductor device according to the first embodiment. In FIG. 1A, the electrode pad 5 of the scribe PCM 4 is illustrated on a left side and the electrode pad 6 of the semiconductor chip 2 is illustrated on a right side.

On the scribe PCM 4, two electrode pads 5 are laminated in the vertical direction. Herein, the uppermost one of the electrode pads 5 of the scribe PCM 4 is made of Cu.

On the semiconductor chip 2, three electrode pads 6 are laminated in a vertical direction. Herein, the uppermost one of the electrode pads 6 of the semiconductor chip 2 is made of Al.

In other words, an uppermost one of electrode pads (herein, the electrode pad 6 of the semiconductor chip 2), on which a bump and a plating coat will be formed by electroless plating (to be described later), is made of Al, and an uppermost one of electrode pads (herein, the electrode pad 5 of the scribe PCM 4), on which none of the bump and the plating coat will be formed by electroless plating, is made of Cu.

Figure 1B:
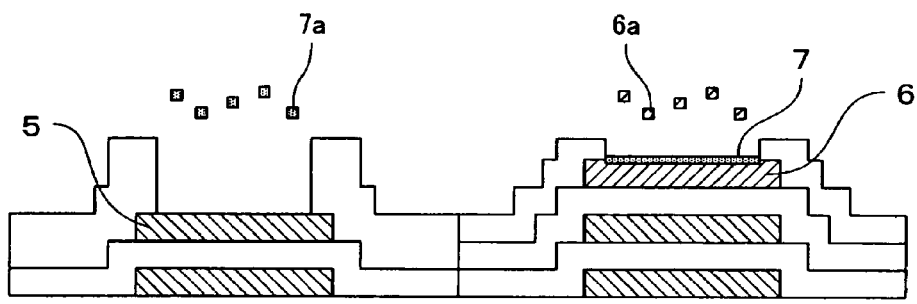

First, as illustrated in FIG. 1B, Zn plating is performed in an electroless manner. Thus, a Zn plating layer 7 is formed on the electrode pad 6 of the semiconductor chip 2. A mechanism of the Zn plating is as follows. That is, Al which is a material for the electrode pad 6 of the semiconductor chip 2 is dissolved in an electroless Zn plating solution as Al ions 6a with difference in ionization tendency between Al and Zn (ionization tendency: Al>Zn). Then, Zn ions 7a in the electroless Zn plating solution are deposited on the electrode pad 6 of the semiconductor chip 2; thus, the Zn plating layer 7 is formed. In other words, displacement plating is performed herein.

Herein, the electrode pad 5 of the scribe PCM 4 is made of Cu. Ionization tendency of Cu is considerably lower than that of Zn; therefore, Cu itself is not dissolved in the electroless Zn plating solution as Cu ions in the displacement plating performed as the electroless plating. Accordingly, the Zn ions 7a in the electroless Zn plating solution are not deposited on the electrode pad 5 of the scribe PCM 4. In other words, the Zn plating layer 7 is not formed on the electrode pad 5 of the scribe PCM 4.

Figure 1C:
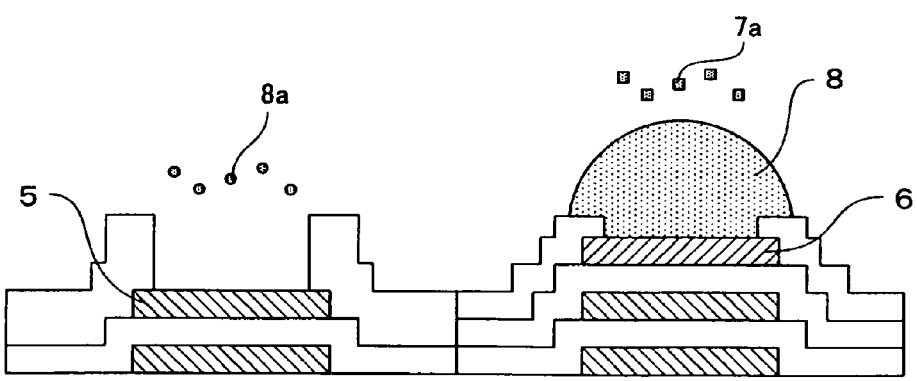

Next, as illustrated in FIG. 1C, Ni plating is performed in an electroless manner. Thus, a Ni bump 8 is formed on the electrode pad 6 of the semiconductor chip 2. A mechanism of the Ni plating is as follows. That is, Zn in the Zn plating layer 7 is dissolved in an electroless Ni plating solution as Zn ions 7a with difference in ionization tendency between Zn and Ni (ionization tendency: Zn>Ni). Then, Ni ions 8a in the electroless Ni plating solution are deposited on the electrode pad 6 of the semiconductor chip 2; thus, the Ni bump 8 is formed. In other words, displacement plating is performed herein.

Also herein, the Zn plating layer 7 is not formed on the electrode pad 5 of the scribe PCM 4. Further, ionization tendency of Cu is lower than that of Ni; therefore, the Ni bump 8 is not formed on the electrode pad 5 of the scribe PCM 4.

Figure 1D:
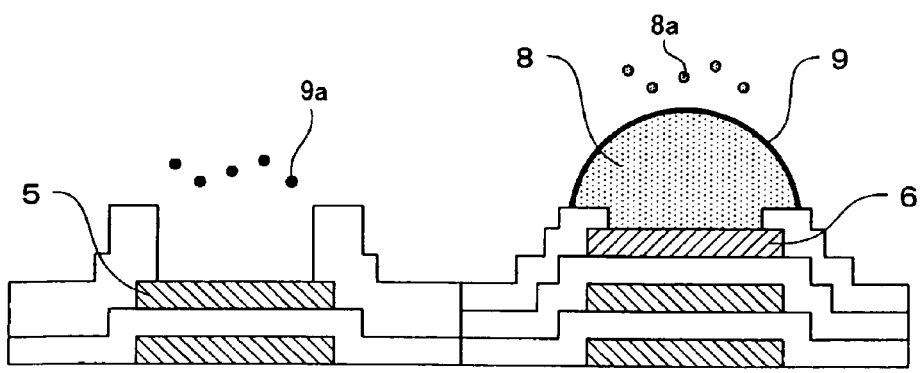

Next, as illustrated in FIG. 1D, Au plating is performed in an electroless manner. Thus, an Au plating layer 9 is formed on the Ni bump 8 on the electrode pad 6 of the semiconductor chip 2. A mechanism of the Au plating is as follows. That is, Ni in the Ni bump 8 is dissolved in an electroless Au plating solution as Ni ions 8a with difference in ionization tendency between Ni and Au (ionization tendency: Ni>Au). Then, Au ions 9a in the electroless Au plating solution are deposited on the Ni bump 8 on the electrode pad 6 of the semiconductor chip 2; thus, the Au plating layer 9 is formed. In other words, displacement plating is performed herein.

Also herein, the Ni bump 8 is not formed on the electrode pad 5 of the scribe PCM 4. Therefore, even in the electroless Au plating solution, the Au plating layer 9 is not formed on the electrode pad 5 of the scribe PCM 4.

The aforementioned method is an electroless plating process for forming a bump on the electrode pad 6 of the semiconductor chip 2 without forming a bump on the electrode pad 5 of the scribe PCM 4.

Figure 2:
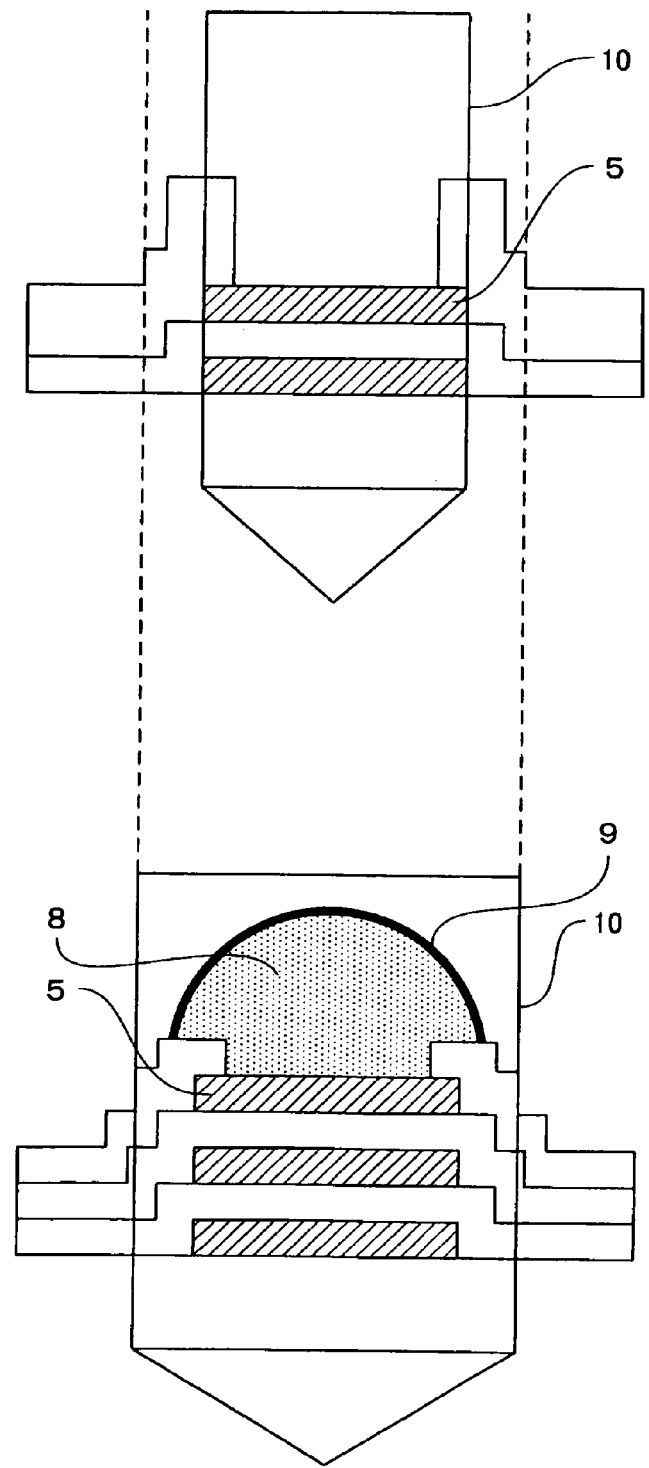
FIG. 2 illustrates a comparison in width between a dicing cutter used in the first embodiment and a conventional dicing cutter.
Figure 5A:
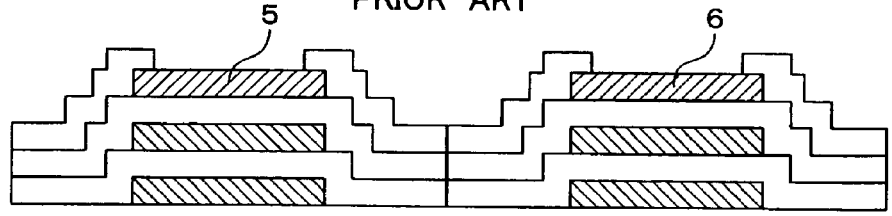
FIGS. 5A to 5D are sectional views each illustrating a process for bump formation in the conventional semiconductor device.
Figure 5B:
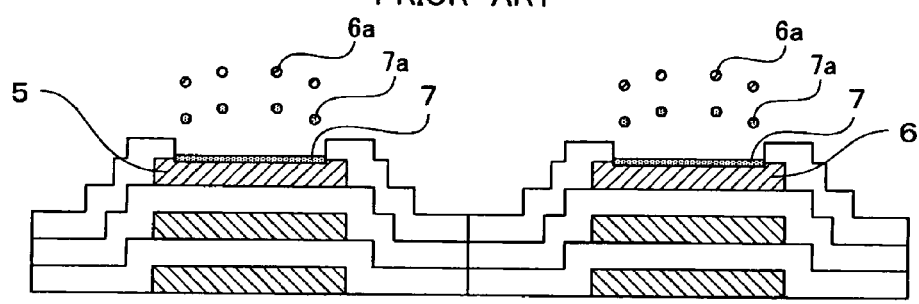
Figure 5C:
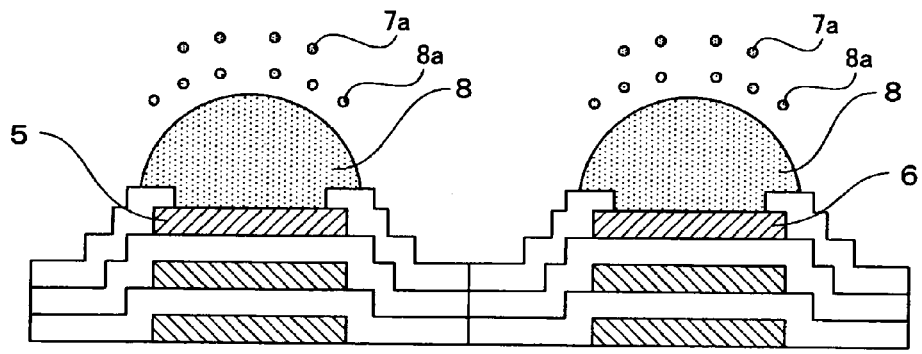
Figure 5D:
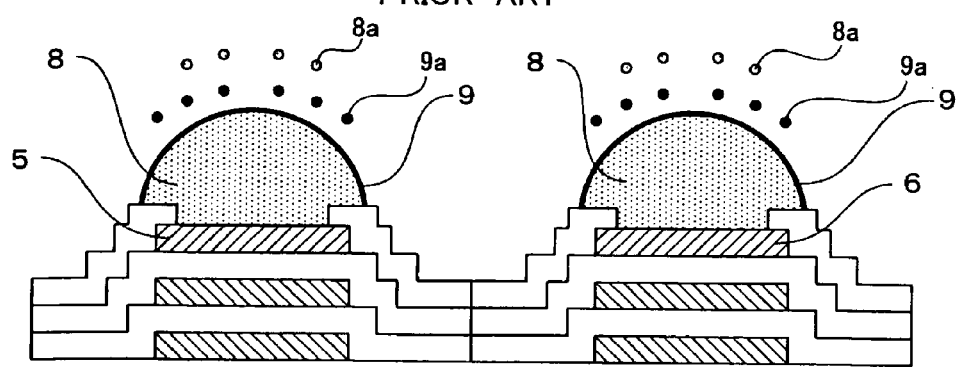
Figure 6:
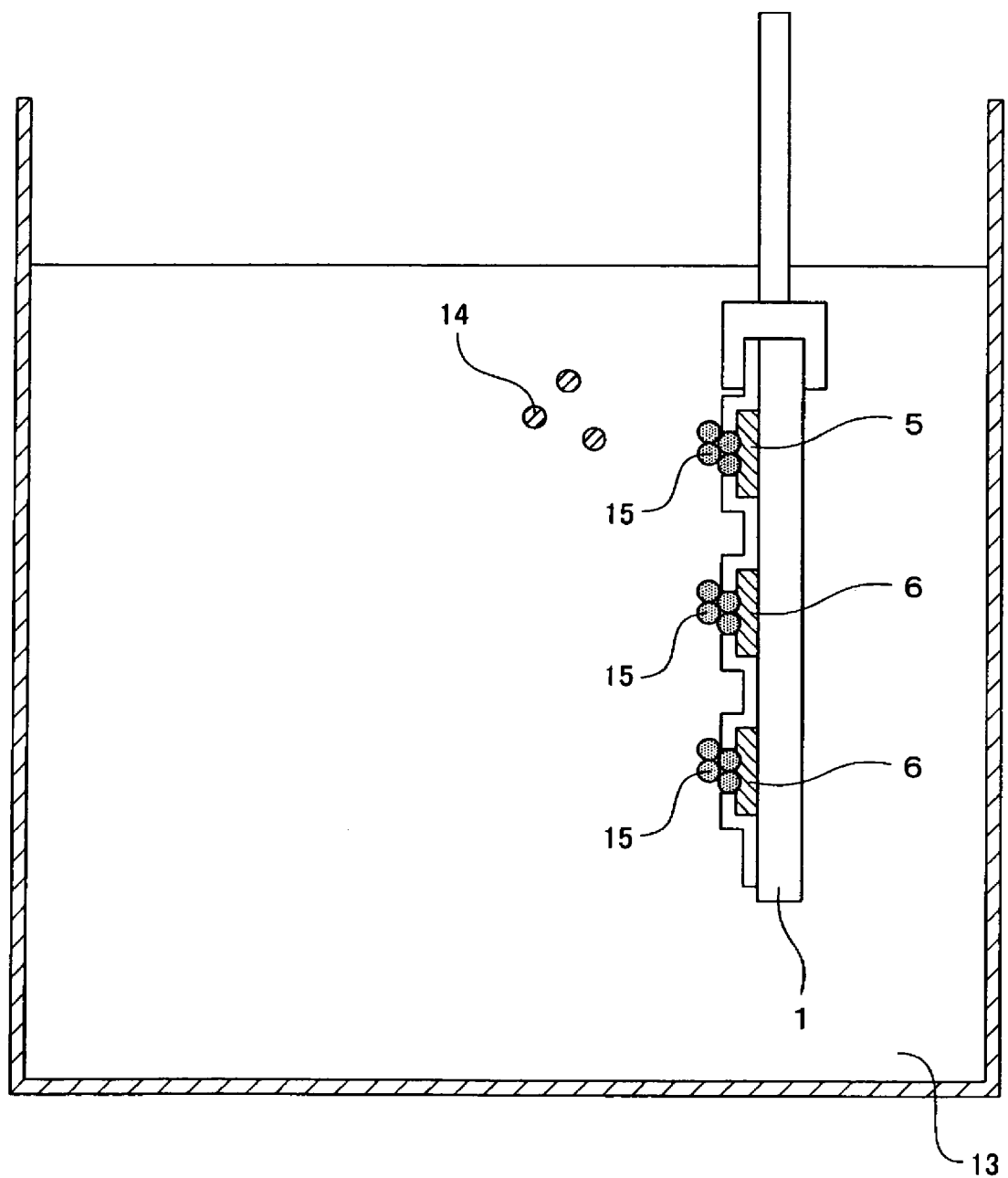
FIG. 6 illustrates an electroless plating method performed on the conventional semiconductor device.
Figure 7A:
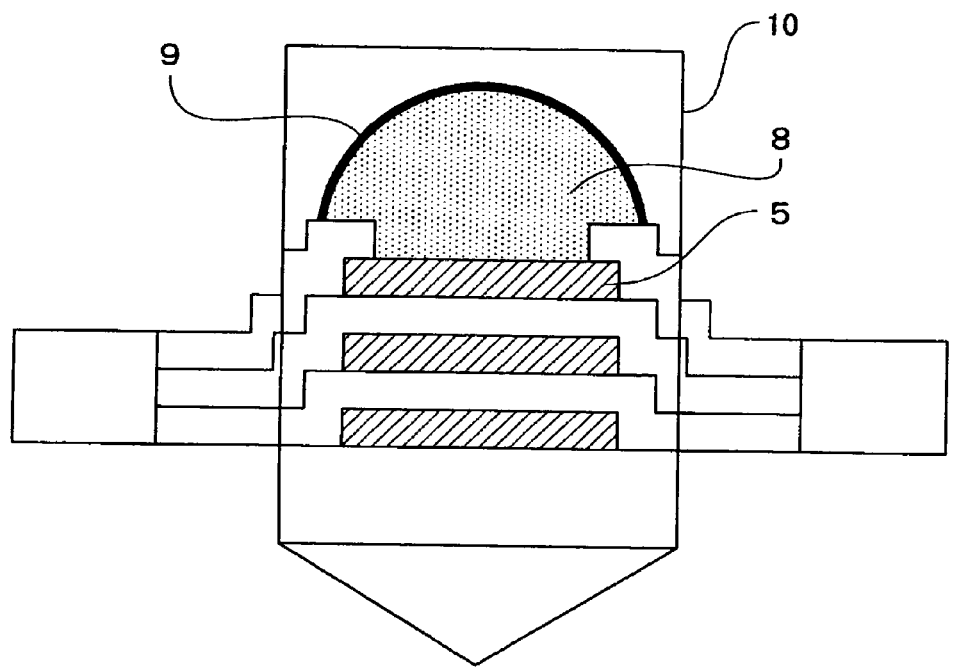
FIGS. 7A and 7B are sectional views each illustrating a dicing process performed on the conventional semiconductor device.
Figure 7B:

FIG. 2 illustrates a comparison between a width of a dicing cutter 10 used for cutting the electrode pad 5 of the scribe PCM 4 with no bump formed on the electrode pad 5 as illustrated in FIG. 1D and the width of the conventional dicing cutter 10 used for cutting the electrode pad 5 of the scribe PCM 4 with a bump formed on the electrode pad 5 as illustrated in FIG. 5D.

Figure 8A:
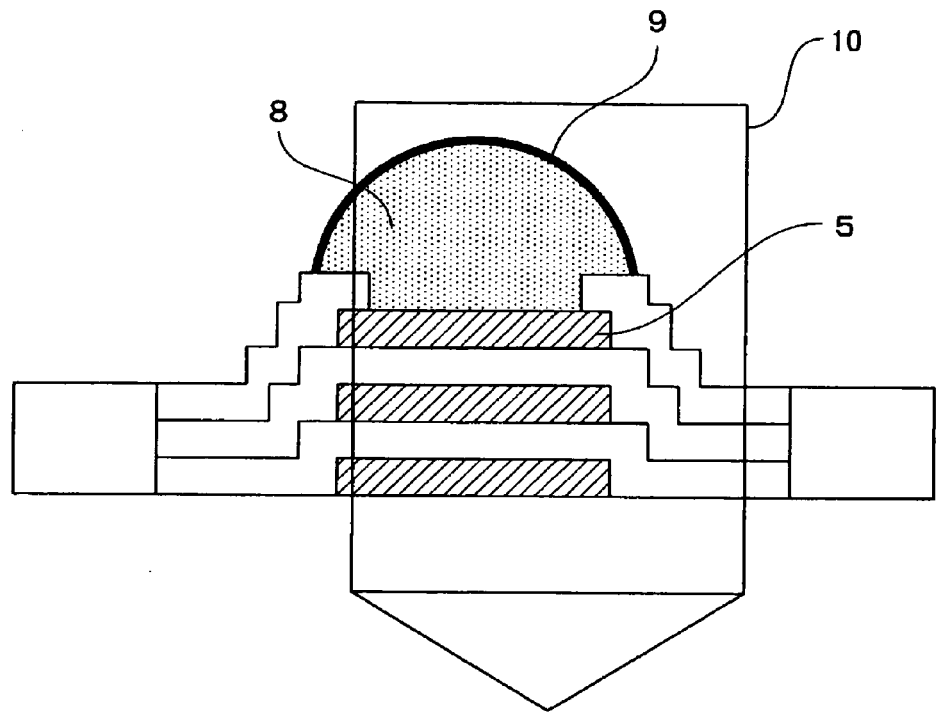
FIGS. 8A and 8B are sectional views each illustrating a dicing process performed on the conventional semiconductor device under another condition.
Figure 8B:
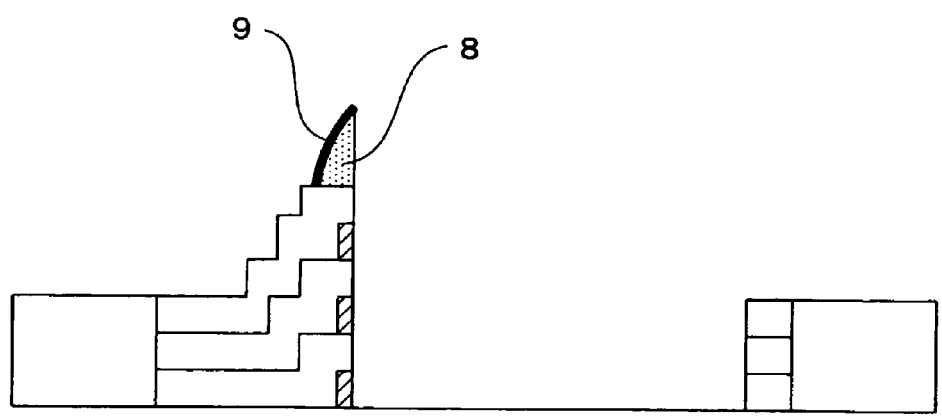
Figure 9:
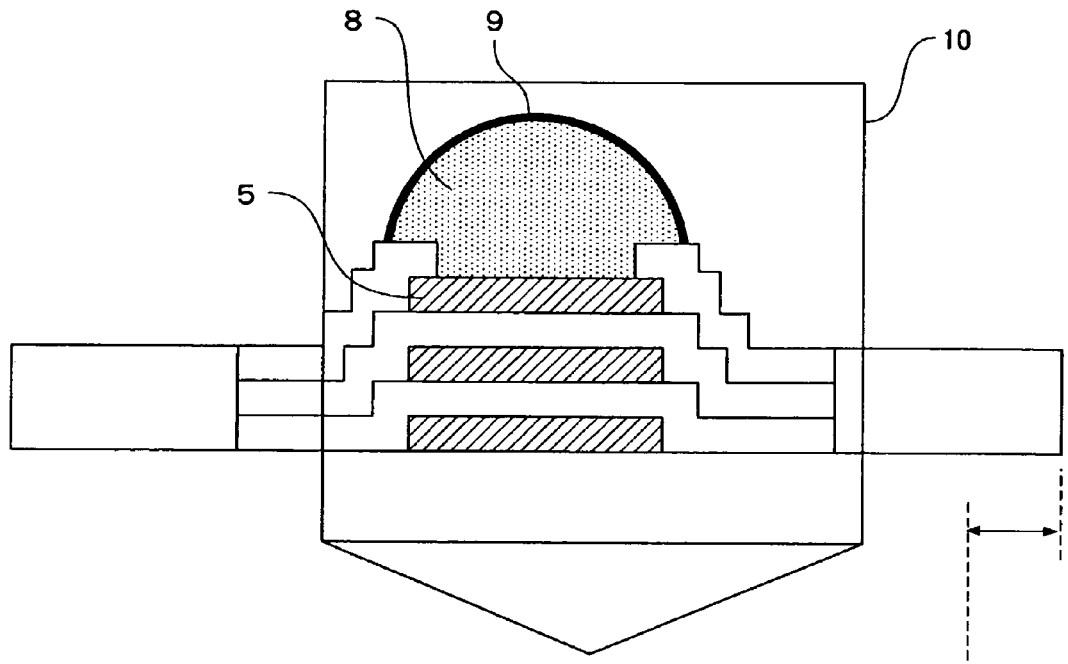
FIG. 9 is a sectional view illustrating a dicing process performed on the conventional semiconductor device under still another condition.
Figure 9:
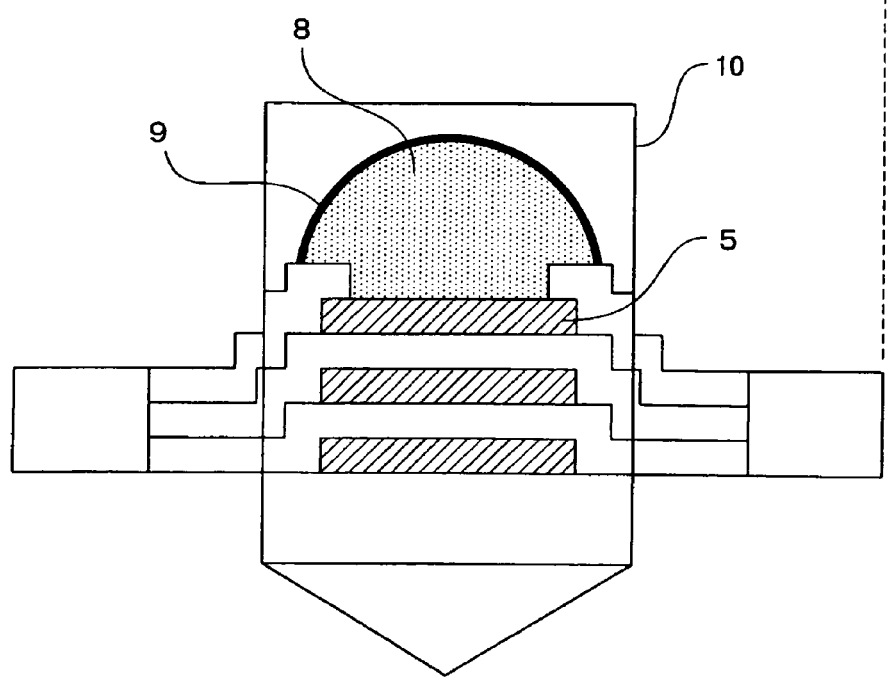

It is apparent from FIG. 2 that the dicing cutter 10 used for cutting the electrode pad 5 of the scribe PCM 4 with no bump formed on the electrode pad 5 is smaller in width than the conventional dicing cutter 10 used for cutting the electrode pad 5 of the scribe PCM 4 with a bump formed on the electrode pad 5. The reason therefor is as follows. Conventionally, as illustrated in a lower side of FIG. 2, the scribe grid 3 (together with the scribe PCM 4, the electrode pad 5 of the scribe PCM 4, and the Ni bump 8 and the Au plating layer 9 on the electrode pad 5) is cut by means of the dicing cutter 10. In such case, as illustrated in FIGS. 8A and 8B, there is a possibility that the Ni bump 8 and the like are partially left at the edge portion. In order to avoid this possibility, the scribe grid 3 must be cut by means of the dicing cutter 10 having a large width. Consequently, the width of the dicing cutter 10, that is, a width of a "spacing" becomes large. This causes a problem that the scribe grid 3 must be made larger in width in conjunction.

According to the first embodiment, as illustrated in an upper side of FIG. 2, no bump is formed on the electrode pad 5 of the scribe PCM 4. As a result, there is no possibility that the Ni bump 8 and the like are partially left at an edge portion. Thus, it is unnecessary to cut the scribe grid 3 by means of the dicing cutter 10 having a large width. In addition, it is unnecessary to make the width of the dicing cutter 10, that is, the width of the "spacing" large.

Accordingly, the scribe grid 3 on the wafer 1 is reduced in area. On the other hand, an area for formation of semiconductor chips 2 each having a semiconductor integrated circuit provided thereon is increased. Thus, it is possible to suppress reduction in number of semiconductor chips 2 to be obtained from one wafer.

Second Embodiment

Next, a description will be given of a semiconductor chip according to a second embodiment of the present invention.

Figure 3:
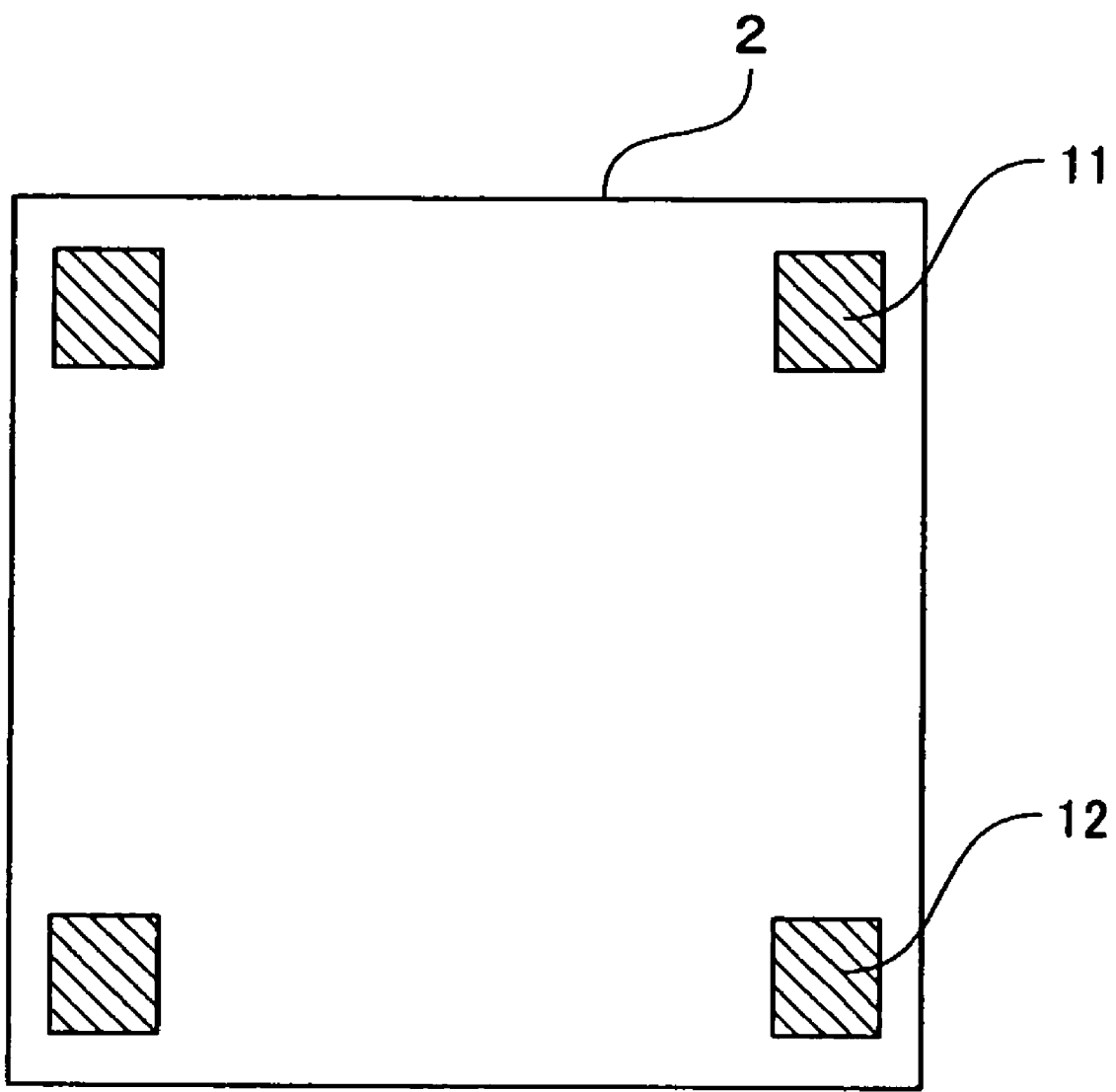
FIG. 3 illustrates an outer appearance of a semiconductor chip in a semiconductor device according to a second embodiment of the present invention.
Figure 4A:
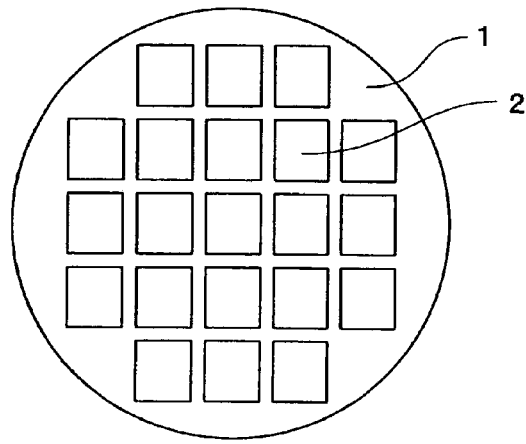
FIG. 4A illustrates a shape of a wafer in a conventional semiconductor device.
Figure 4B:
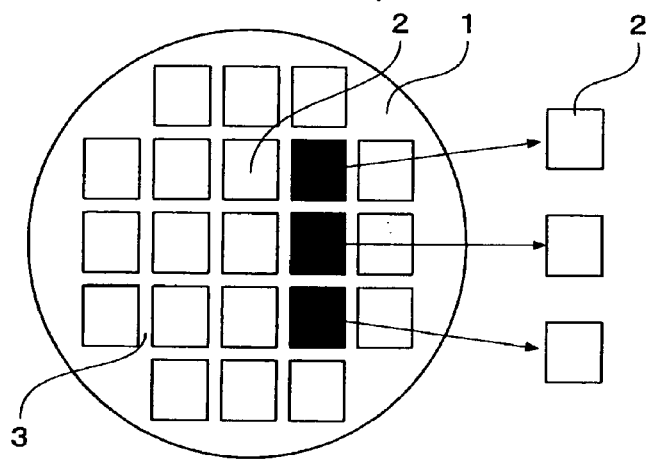
FIG. 4B illustrates a state in which a semiconductor chip is cut out from the wafer in the conventional semiconductor device.
Figure 4C:
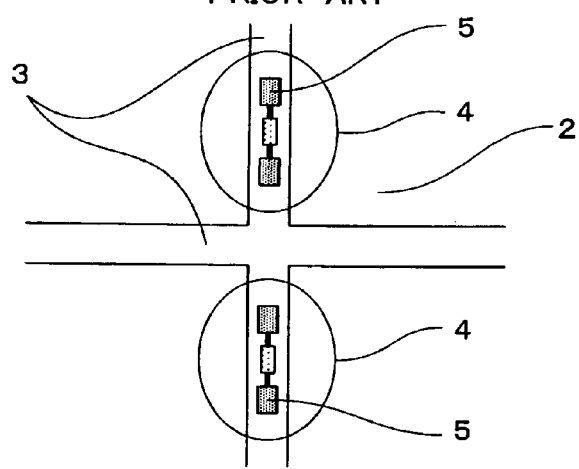
FIG. 4C illustrates a shape of a scribe PCM on the wafer in the conventional semiconductor device.

FIG. 3 illustrates an outer appearance of a semiconductor chip cut out from the semiconductor device according to the second embodiment. As illustrated in FIG. 3, for example, an electrode pad 11 made of Al, on which a bump will be formed by electroless plating, and an electrode pad 12 made of Cu, on which no bump will be formed by electroless plating, are formed on a semiconductor chip 2. Herein, bump formation is performed on each of the electrode pads on the semiconductor chip 2 by the electroless plating process described with reference to FIGS. 1A to 1D.

As described above with reference to FIGS. 1A to 1D, the bump is not formed on the electrode pad 12 made of Cu, but is formed on the electrode pad 11 made of Al. That is, the structure of the semiconductor chip has an advantage in that electroless plating can be selectively performed, over a conventional technique.

What is claimed is:

1. A method of manufacturing a semiconductor device having a bump, comprising:

providing a substrate;

forming a semiconductor chip on the substrate;

forming a first electrode pad area on the semiconductor chip, the first electrode pad area having a plurality of electrode pads, a top electrode pad among the plurality of electrode pads comprising a first metal;

forming a second electrode pad area on the semiconductor chip, the second electrode pad area having a plurality of electrode pads, a top electrode pad among the plurality of electrode pads comprising a second metal; and electroless plating of the first and second electrode pad areas, thereby forming a bump on the first electrode pad area, and not forming a bump on the second electrode pad area, wherein the bump directly contacts the top electrode pad of the first electrode pad area, the first metal has an ionization tendency higher than that of the bump, and the second metal has an ionization tendency lower than that of the bump.

2. A method of manufacturing a semiconductor device having a bump according to claim 1, wherein the first metal is Al and the second metal is Cu.

3. A method of manufacturing a semiconductor device having a bump according to claim 2, wherein the bump is made of Ni.

4. A method of manufacturing a semiconductor substrate having a bump, comprising:

providing a substrate;

forming a semiconductor chip and a scribe grid on the substrate;

forming a first electrode pad area on the semiconductor chip, the first electrode pad area having a plurality of electrode pads , a top electrode pad among the plurality of electrode pads comprising a first metal;

forming a second electrode pad area on the scribe grid, the second electrode pad area having a plurality of electrode pads, a top electrode pad among the plurality of electrode pads comprising a second metal;

electroless plating of the first and second electrode pad areas, thereby forming a bump on the first electrode pad area, and not forming a bump on the second electrode pad area, wherein the bump directly contacts the first metal, the first metal has an ionization tendency higher than that of the bump, and the second metal has an ionization tendency lower than that of the bump.

5. A method of manufacturing a semiconductor substrate having a bump according to claim 4, wherein the first metal is Al, and the second metal is Cu.

6. A method of manufacturing a semiconductor substrate having a bump according to claim 5, wherein the bump is made of Ni.

7. A method of manufacturing a semiconductor device having a bump according to claim 4, further comprising cutting the substrate on the second electrode pad area.

8. A method of manufacturing a semiconductor device having a bump according to claim 4, wherein the first electrode pad area has three electrode pads, and the second electrode pad area has two electrode pads.

9. A method of manufacturing a semiconductor device having a bump according to claim 4, wherein there is no material between the bump and the first metal.

10. A method of manufacturing a semiconductor substrate having a bump, comprising:

providing a substrate;

forming a semiconductor chip and a scribe grid on the substrate;

forming an Al electrode pad on the semiconductor chip;

forming a Cu electrode pad on the scribe grid;

electroless Zn plating forming a Zn plating layer on the Al electrode pad;

electroless Ni plating forming a Ni bump on the Al electrode pad.

11. A method of manufacturing a semiconductor device having a bump according to claim 10, further comprising electroless Au plating forming an Au plating layer on the Ni bump.

12. A method of manufacturing a semiconductor device having a bump according to claim 11, further comprising cutting the substrate on the Cu electrode pad.

* * * * *